US006529088B2

(12) United States Patent
Lafleur et al.

(10) Patent No.: US 6,529,088 B2

(45) Date of Patent: Mar. 4, 2003

(54) CLOSED LOOP ANTENNA TUNING SYSTEM

(75) Inventors: Philippe Lafleur, Gloucester (CA); David Roscoe, Kanata (CA)

(73) Assignee: Vistar Telecommunications Inc., Ottawa (CA)

( * ) Notice: Subject to any disclaimer, the term of this patent is extended or adjusted under 35 U.S.C. 154(b) by 0 days.

(21) Appl. No.: 09/745,434

(22) Filed: Dec. 26, 2000

(65) Prior Publication Data

US 2002/0079982 A1 Jun. 27, 2002

(51) Int. Cl.[7] .............................. H03J 7/00; H04B 1/14

(52) U.S. Cl. .......................... 333/17.1; 455/73; 455/78; 455/82; 343/700 MS

(58) Field of Search .............................. 455/73, 78, 82, 455/84; 343/700 MS; 333/17.1

(56) References Cited

U.S. PATENT DOCUMENTS 5,021,795 A 6/1991 Masiulis ..................... 343/700
5,472,935 A 12/1995 Yandrofski et al. ......... 505/210
5,565,875 A 10/1996 Buralli et al. ............... 343/700
5,589,845 A 12/1996 Yandrofski et al. ........... 343/90
5,617,104 A * 4/1997 Das ...................... 343/700 MS
5,680,141 A 10/1997 Didomenico et al. ....... 342/372
5,952,971 A * 9/1999 Strickland ............ 343/700 MS
6,005,519 A 12/1999 Burns ......................... 343/700
6,014,554 A * 1/2000 Smith .......................... 455/340
6,075,485 A 6/2000 Lilly et al. .................. 343/700
6,078,223 A 6/2000 Ramonofsky et al. ......... 331/9
6,097,263 A 8/2000 Mueller et al. ............ 333/17.1
6,140,965 A 10/2000 Van Hoozen ............... 343/700

* cited by examiner

*Primary Examiner*—Justin P. Bettendorf
*Assistant Examiner*—Damian E Cathey
(74) *Attorney, Agent, or Firm*—Marks & Clerk

(57) ABSTRACT

A tunable resonant system includes an electric element, and a core having a controllable parameter that determines the resonant frequency of the system. In order to tune the resonant system to a desired frequency, a low power, narrowband signal is applied at a selected frequency to the electric element. The reflected or transmitted power is measured and the value of the controllable parameter adjusted to vary the resonant frequency of the system in a closed loop until the reflected power is at a minimum.

21 Claims, 2 Drawing Sheets

CLOSED LOOP ANTENNA TUNING SYSTEM

BACKGROUND OF THE INVENTION

1. Field of the Invention

This invention relates generally to frequency agile resonant components, such as filters, resonators and antennas, and more particularly to a system for tuning such components to a target frequency.

2. Background of the Invention

The bandwidth of resonant components, such as antennas and certain types of filters, is critically dependent on size. A narrowband antenna can be made much smaller than an antenna of wider bandwidth. Since satellite communication systems operate at different transmit and receive frequencies, for example 1650 MHz transmit, and 1550 MHz receive, antennas must have sufficient bandwidth to cover both transmit and receive frequencies. As a result, a typical patch antenna covering both frequency bands, for example, needs to be over 2 inches in diameter, whereas a similar antenna covering only one of the frequencies of interest (i.e. part of one band) can be made under one inch in diameter.

There are four basic types of tuning for frequency agile components: mechanical, electronic, magnetic and electric. Mechanically tuned components typically extend or contract one or more of their physical resonant dimensions to vary the resonant frequency. Electronically tuned components typically use electronic devices connected directly to the component to modify the resonant frequency. Magnetically tuned components typically use magnetic fields to vary the permeability of the component, which is typically made of a ferrite material. The change in permeability changes the effective electrical dimension, or value, of the component, thereby varying the resonant frequency. Electrically tuned components typically use electric fields to vary the permittivity of the component, which is typically made of a ferroelectric material. The change in permittivity changes the effective electrical dimension of the component, or value, thereby varying the resonant frequency.

Common examples of frequency agile components include filters, resonators and antennas. In the prior art, the frequency agile component was considered to be a system on its own. This lead to carefully calibrated open loop systems. The effect of the control mechanism on resonant frequency had to be well known, as well as the effect of temperature, and the presence of objects in the reactive nearfield, aging, etc., which could not always be predicted, for example, a hand near the antenna. The communications device would simply adjust the control signal to the value from a look-up table (or equivalent) that corresponded to that frequency. The quality of the input match would be unknown, thereby providing no guarantee that the component was properly tuned.

For mobile communications equipment, tuning error can result in permanent loss of contact. The more narrowband the component is, the more critical the tuning precision, and consequently such systems are unsuitable for using in communications systems with different transmit and receive frequencies.

A closed loop method for component tuning is known that involves the use of a received signal strength indicator (RSSI). The system tunes the component to maximize the RSSI value. For systems where the transmit frequency is not the same as the receive frequency, this technique is not available, as the component can not be tuned for transmitting. Even in a receive-only, or shared frequency system, if the communications device is out of coverage or blocked, the component would not be tuned. With the component detuned, the communications device might never lock on to the receive signal again, or take an excessively long time to do so. Furthermore, as with other methods, the quality of the input match would be unknown.

U.S. Pat. No. 6,097,263 describes a closed loop tuning system for resonant cavities wherein the resonant frequency of the cavity is sensed and an electric device in the cavity is altered until the desired resonant frequency is attained. Such a device is not suitable for antennas since they are radiating into free space. Furthermore, a system as described in U.S. Pat. No. 6097263 would not be suitable for integration within a wireless transceiver. Finally, emissions specifications are not addressed in the invention disclosed by U.S. Pat. No. 6097263.

SUMMARY OF THE INVENTION

According to the present invention there is provided a tunable resonant system, comprising an electric element; a core having a controllable parameter that determines the resonant frequency of the system; a frequency generator for supplying a low power, narrowband signal at a selectable frequency to said electric element; an arrangement for measuring the reflected or transmitted power of said applied narrowband signal; and a controller for adjusting the value of said controllable parameter to vary the resonant frequency of the system in a closed loop until the reflected power is at a minimum.

Typically, the resonant system is an antenna, such as a patch antenna suitable for satellite communications, but the invention is also applicable to other resonant systems, such as filters and resonators. While it is possible to measure the transmitted power, measurement of the reflected power is preferred.

In systems that have different transmit and receive frequencies, the invention permits the use of an antenna of bandwidth that merely needs to be sufficient to accommodate one of the transmit and receive frequencies at a time. This permits a significant reduction in the physical size of the antenna. An antenna having a diameter in the order of one inch is suitable to accommodate transmit and receive frequencies at 1550 MHz and 1650 MHz.

An additional advantage of the invention is that the narrowband antenna can in itself act as a filter tuned to the carried frequency of the transmit or receive signal and thereby simplify the front-end RF electronics of the transmitter and receiver.

This invention eliminates the division between the frequency agile component and the communications device. The electronics used in the communications device are reused to form a closed loop frequency tuning system for the component.

The component is tuned to the required frequency in a guard time immediately prior to a transmission or reception.

The invention has the advantage that the need for highly accurate and detailed calibration is eliminated because of the error tolerant nature of the closed loop tuning scheme. The hardware required to tune the component reuses existing electronics in the communications device. An open loop system based on a simple calibration is used to accelerate the tuning process. Furthermore, the quality of the input match is known. Additionally, the method is not dependant on being within network coverage since the signal used to tune the antenna is generated locally.

The invention automatically accounts for temperature variation since the resonant frequency is found for any particular set of conditions. In the prior art, heaters were used eliminate temperature variation, and such heaters are not required with the present invention.

The invention also provides a method of tuning a resonant system including an electric element and a core having a controllable parameter that determines the resonant frequency of the system, comprising supplying a low power, narrowband signal at a selectable frequency to said electric element; measuring the power of said applied narrowband signal that is reflected or transmitted from said electric element; and adjusting the value of said controllable parameter to vary the resonant frequency of the system in a closed loop until the reflected power is at a minimum.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

The invention will be described in connection with a patch antenna for a dual frequency satellite communications system, although it has other applications as noted above.

Figure 1:
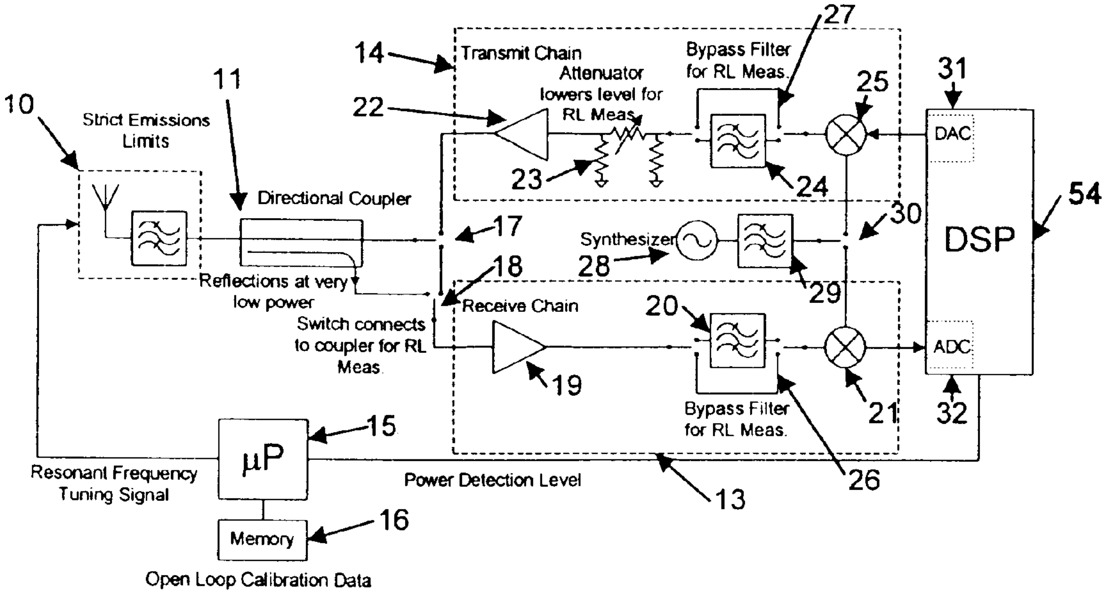
FIG. 1 is a block diagram of a closed loop tuning system in accordance with one embodiment of the invention.

In FIG. 1, the communications system comprises a patch antenna 10 either connected to receive chain 13 through a directional coupler 11, or transmit chain 14, which it turn are connected to a digital signal processor (DSP) 54. The DSP 14 is connected to microprocessor 15, which is connected to memory 16. The microprocessor supplies a resonant frequency tuning signal to the antenna 10. Switch 17 selects either transmission or reception, and switch 18 selects either reception or return loss measurement.

The receive chain 13 consists of an amplifier 19, bandpass filter 20 and mixer 21. The transmit chain consists of an amplifier 22, attenuator 23, bandpass filter 24, and mixer 25. Each bandpass filter 20, 24 can be bypassed with bypass circuits 26, 27.

Frequency synthesizer 28 can be connected through filter 29 and switch 30 to mixer 25 or 21.

DSP 54, which processes the received signals, includes analog-to-digital converter (ADC) 32 and digital-to-analog converter (DAC) 31.

Figure 4:
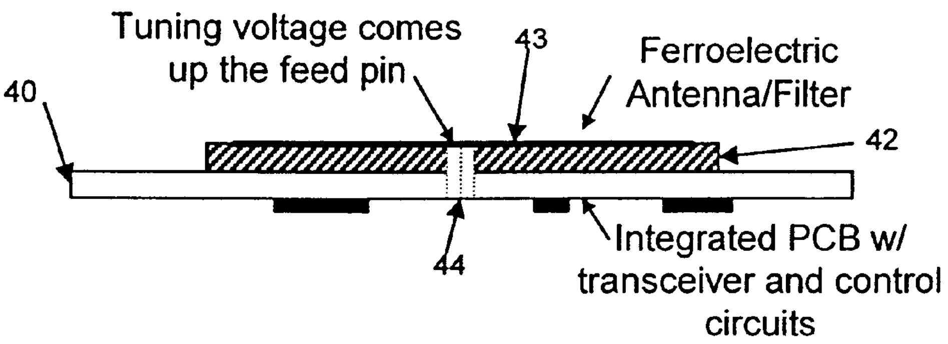
FIG. 4 is a schematic diagram of a tunable patch antenna.

The antenna 10 is shown in more detail in FIG. 4. The antenna 10 is mounted on a printed circuit board 40 having circuits placed thereon. Electric antenna element 43 is mounted on a ferroelectric core 42 of, for example, Barium Strontium Titanate (BSTO). A DC bias voltage is applied to a feed pin 44 for the antenna and this determines the resonant frequency of the system by changing the permittivity of the ferroelectric material.

Figure 3:
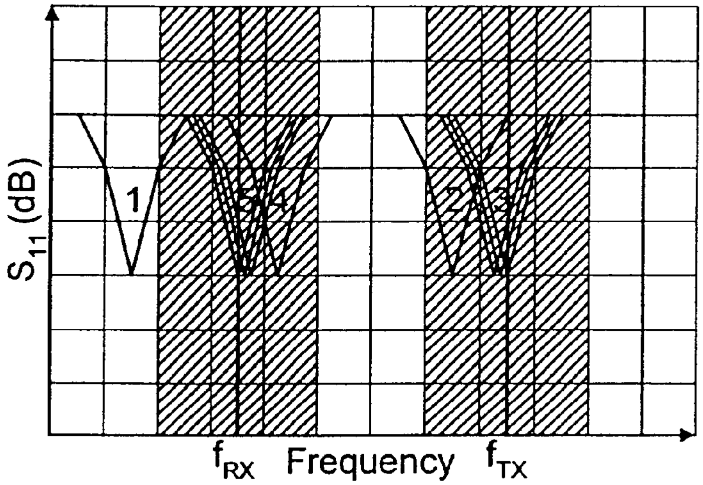
FIG. 3 is a graph showing frequency against reflected power.
Figure 2:
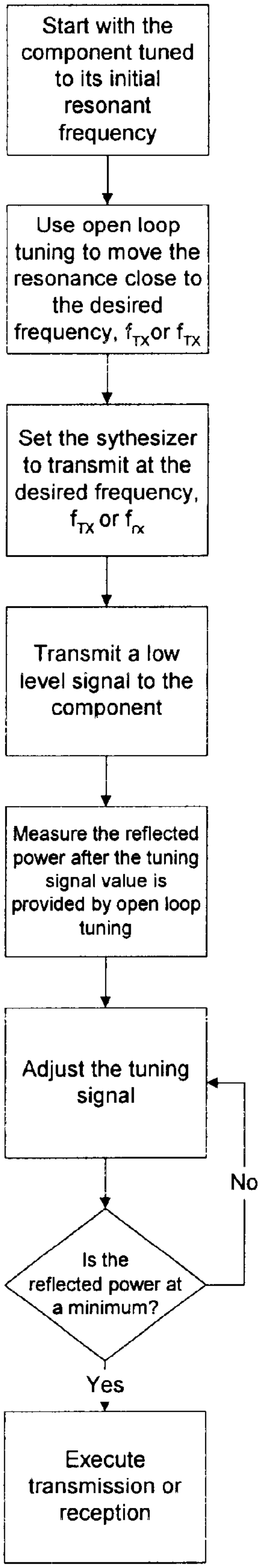
FIG. 2 is a flow chart describing the operation of the system.

The microprocessor 15 controls the tuning of the antenna as shown in more detail in FIGS. 2 and 3. In a guard time prior to a transmission or reception operation, the antenna is tuned to the appropriate frequency. First, the bias voltage is set at a predicted value based on values set in a look-up table in the memory. These can be based on calculated values and also on values from prior experience based on previous tuning operations. This ensures that tuning can be commenced with the component set as close as possible to the actual value.

First, the microprocessor 15 sets the synthesizer 28 to the frequency of the desired transmission or reception. The transmitter is then activated at a sufficiently low power level to comply with emissions regulations bearing in mind that the initial transmission may be unauthorized. In other words, the transmitted power is so low that any emission from the antenna 10 is not considered to constitute a transmission for the purposes of the communications regulations. Such powers are typically in the order of −100 dBm and are many orders of magnitude less than the normal transmitted power. This is important because the antenna is radiating during the tuning process.

The resonant frequency tuning signal is then set to an initial level determined by an open loop control signal that is believed appropriate for the target frequency. This open loop control signal is derived from an initial calibration, or a previously used value.

The reflected power is sampled by the directional coupler 11, which is then measured using a power detector. In this preferred embodiment, wherein the reflected power is measured, the receive chain serves to measure the reflected power and thereby acts as the power detector, but it will be understood that other means of measuring the power could equally well be employed. Because of the very low level of the signals, involved, a high degree of sensitivity is required. The control signal is then tuned until the reflected power is at a minimum, which indicates that the antenna is matched and tuning is complete. Immediately following the completion of tuning, the transmission or reception is executed. This method ensures that the component is correctly tuned, with the added benefit that the quality of the impedance match is known.

FIG. 3 shows graphically how the tuning method works. In FIG. 3, position 1 is an arbitrary starting point. Initially, assuming it is desired to send a transmission, the target frequency is $f_{TX}$. The component is tuned via open loop methods to position 2. Then, using closed loop tuning, it closes in on the desired frequency until reflection is a minimum at position 3.

When it is desired to receive, the target frequency is now $f_{RX}$. The component is initially tuned via open loop to position 4. It is then tuned with the aid of the closed loop method to position 5 and reception can commence.

The signals are processed in the DSP in a conventional manner.

The invention allows for the use of a narrowband component in a wideband system, permits rapid tuning because of combinations of open and closed loop tuning, can be implemented in fully integrated closed loop circuitry, compensates for temperature variation, aging and other effects, permits the quality of the input match to be known, and does not violate emissions limits.

The described method for tuning frequency agile component makes the use of very narrowband tunable components possible in a wideband system.

We claim:

1. A tunable resonant system, comprising:

an electric element;

a core having a controllable parameter that determines the resonant frequency of the system;

a frequency generator for supplying a low power, emissions compliant, narrowband signal at a selected frequency to said electric element;

an arrangement for measuring the reflected power of said applied narrowband signal in a receive chain;

a controller for adjusting the value of said controllable parameter in a closed loop to vary the resonant frequency of said system until the reflected power is at a mininum;

a passband filter for said narrowband signal in said receive chain; and a bypass circuit for bypassing said passband filter during frequency tuning.

2. A tunable system as claimed in claim 1, wherein said core is a dielectric core having a permittivity that depends on an applied voltage.

3. A tunable system as claimed in claim 2, wherein said core is made of a ferroelectric material.

4. A tunable system as claimed in claim 3, wherein said electric element is an antenna.

5. A tunable system as claimed in claim 4, wherein said antenna is a patch antenna.

6. A tunable system as claimed in claim 2, further comprising a memory for storing calibration data to permit an initial open loop tuning step prior to fine tuning with said closed loop.

7. A tunable system as claimed in claim 6, wherein said controller is a microcontroller connected to said memory.

8. A tunable resonant system, comprising:

an electric element;

a dielectric core having a permittivity that depends on an applied voltage and determines the resonant frequency of the system;

a frequency generator for supplying a low power, emissions compliant, narrowband signal at a selected frequency to said electric element;

an arrangement for measuring the reflected power of said applied narrowband signal; and a controller for adjusting the value of said applied voltage in a closed loop to vary the resonant frequency of said system until the reflected power is at a minimum;

a receive chain and transmit chain operating at different frequencies, each chain incorporating a passband filter; and a bypass circuit for bypassing said passband filters during frequency tuning.

9. A tunable system as claimed in claim 8, further comprising an attenuator in said transmit chain and controlled by said controller for reducing transmit power during tuning of said system.

10. A tunable system as claimed in claim 9, wherein said arrangement measures reflected power.

11. A tunable system as claimed in claim 10, wherein said receive chain serves as the arrangement for measuring the reflected power.

12. A method of tuning a resonant system including a transmit chain and a receive chain, each chain including a passband filter, an electric element, and a core having a controllable parameter that determines the resonant frequency of the system, comprising:

supplying a low power, emissions compliant, narrowband signal at a selectable frequency to said electric element;

measuring the power of said applied narrowband signal that is reflected from said electric element in said receive chain;

adjusting the value of said controllable parameter to vary the resonant frequency of said system in a closed loop until the reflected power is at a minimum; and bypassing said passband filters during frequency tuning.

13. A method as claimed in claim 12, wherein said core has a permittivity that is varied by changing an applied bias voltage so as to change the resonant frequency of said system.

14. A method as claimed in claim 13, wherein said system is initially tuned using calibration data stored in a memory prior to initiating fine tuning with said closed loop.

15. A method as claimed in claim 14, wherein said calibration data is determined from prior tuning steps with said closed loop.

16. A method as claimed in claim 15, wherein said electric element is an antenna forming part of a wireless system having different transmit and receive frequencies, and said antenna is tuned to each of said transmit and receive frequencies prior to a transmit or receive operation.

17. A method as claimed in claim 16, wherein said tuning takes place during a guard time prior to each transmission or reception.

18. A method as claimed in claim 14, wherein said bias voltage is applied to a feed pin of said electric element.

19. A method as claimed in claim 12, wherein said receive chain forms part of a communications system.

20. A method of tuning a resonant system including an electric element and a core having a controllable parameter that determines the resonant frequency of the system, comprising:

supplying a low power, emissions compliant, narrowband signal at a selectable frequency to said electric element;

measuring the power of said applied narrowband signal that is reflected from said electric element, said reflected narrowband signal passing through a passband filter;

adjusting the value of said controllable parameter to vary the resonant frequency of said system in a closed loop until the reflected power is at a minimum; and bypassing said passband filter during frequency tuning.

21. A method as claimed in claim 20, wherein said narrowband signal is applied to said electric element from said transmit chain, and an attenuator is included in said transmit chain to reduce the power of the applied signal.

* * * * *